(12) United States Patent
Peng et al.

(10) Patent No.: US 7,286,019 B2
(45) Date of Patent: Oct. 23, 2007

(54) METHOD AND SYSTEM FOR AMPLIFYING A SIGNAL

(75) Inventors: Solti Peng, Plano, TX (US); Chien-Chung Chen, Plano, TX (US); Abdellatif Bellaouar, Richardson, TX (US); Heng-Chih Lin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 11/031,185

(22) Filed: Jan. 7, 2005

(65) Prior Publication Data

US 2006/0152288 A1    Jul. 13, 2006

(51) Int. Cl.
*H03F 3/04* (2006.01)

(52) U.S. Cl. .................. 330/311; 330/289; 330/285; 330/296

(58) Field of Classification Search ................ 330/283, 330/285, 296, 311
See application file for complete search history.

(56) References Cited

U.S. PATENT DOCUMENTS

| | | | | |
|---|---|---|---|---|
| 6,122,532 A | * | 9/2000 | Taylor | ......................... 330/296 |
| 6,133,793 A | * | 10/2000 | Lau et al. | .................... 330/310 |
| 6,754,478 B1 | * | 6/2004 | Lee et al. | .................... 330/253 |
| 6,850,120 B2 | * | 2/2005 | Heima et al. | ............... 330/331 |

* cited by examiner

*Primary Examiner*—Khanh Van Nguyen
(74) *Attorney, Agent, or Firm*—William B Kempler; W. James Brady, III; Frederick J. Telecky, Jr.

(57) ABSTRACT

According to one embodiment of the invention, an amplifier includes a gate bias circuit operable to generate a gate bias voltage and a common gate amplifier that includes a transistor having a gate biased by an output of the gate bias circuit and also having a source connected to an inductor for providing a path to ground for direct current flowing through the transistor. According to another embodiment of the invention, a method for amplifying a signal by an amplifier includes generating a gate bias voltage indicative of a difference between a reference voltage and an output voltage of the amplifier, biasing the gate of the common-gate amplifier with the gate bias voltage, and blocking, by a passive device, alternating current signals from flowing from the source of the transistor to ground.

15 Claims, 2 Drawing Sheets

METHOD AND SYSTEM FOR AMPLIFYING A SIGNAL

TECHNICAL FIELD OF THE INVENTION

This invention relates generally to signal amplification and more particularly, but without limitation, to a method and system for process, voltage, and temperature insensitive amplification for a CMOS passive mixer.

BACKGROUND OF THE INVENTION

Mixers are often used for front end receivers for a wireless handset such as a cell phone. A mixer is used to convert received radio frequency signals to a lower frequency for easier signal processing. The mixer is also referred to as a frequency converter. An important requirement for a mixer is its lineary. Although active mixers have been used, such as those incorporating the Gilbert cell topology, passive mixers which have no gain are often used because of their high linearity and low noise when compared to the active mixers. However, passive mixers often need an input gain stage, which contributes to a non-linear response of the mixer.

Attempts to address such linearity problems include the use of a resistance load within the gain stage amplifier. However, resistance values may vary during integrated circuit fabrication as well as vary with temperature. Thus, the output DC voltage of the resulting amplifier may be both process and temperature dependent, which is undesirable.

Highly linear amplifiers are also desirable in contexts other than as an input gain stage to a passive mixer.

SUMMARY OF THE INVENTION

According to one embodiment of the invention, an amplifier includes a gate bias circuit operable to generate a gate bias voltage and a common gate amplifier that includes a transistor having a gate biased by an output of the gate bias circuit and also having a source connected to an inductor for providing a path to ground for direct current flowing through the transistor. According to another embodiment of the invention, a method for amplifying a signal by an amplifier includes generating a gate bias voltage indicative of a difference between a reference voltage and an output voltage of the amplifier, biasing the gate of the common-gate amplifier with the gate bias voltage, and blocking, by a passive device, alternating current signals from flowing from the source of the transistor to ground.

Some embodiments of the invention provide numerous technical advantages. Some, none, or all embodiments of the invention may benefit from the below-described advantages. According to one embodiment of the invention, a method and system are provided that amplify radio frequency and lower frequency signals with high linearity, and with independence from process, voltage, and temperature variation.

Other technical advantages will be readily apparent to one skilled in the art.

BRIEF DESCRIPTION OF THE DRAWINGS

For a more complete understanding of the present invention and its advantages, references now made to the following description, taken in conjunction with the accompanying drawings, in which.

DETAILED DESCRIPTION OF THE INVENTION

Figure 1A:
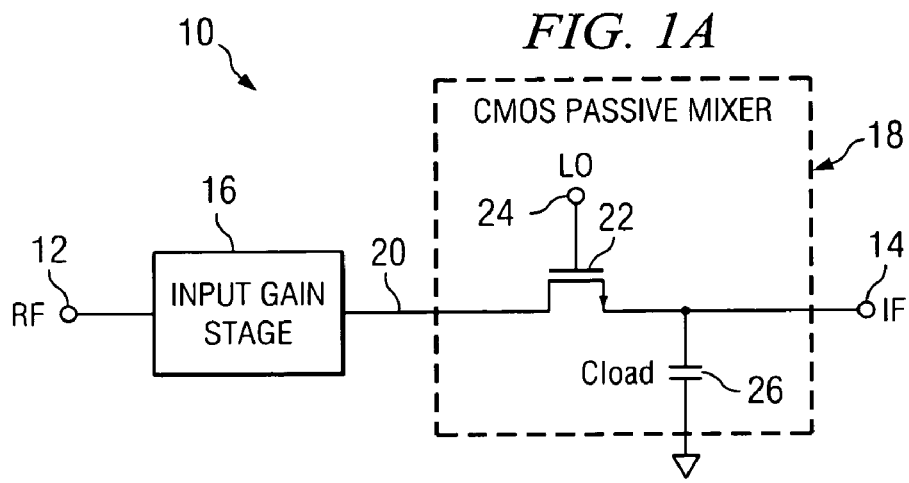
FIG. 1A is a circuit diagram illustrating a conventional frequency converter having an input gain stage and a CMOS passive mixer.
Figure 1B:
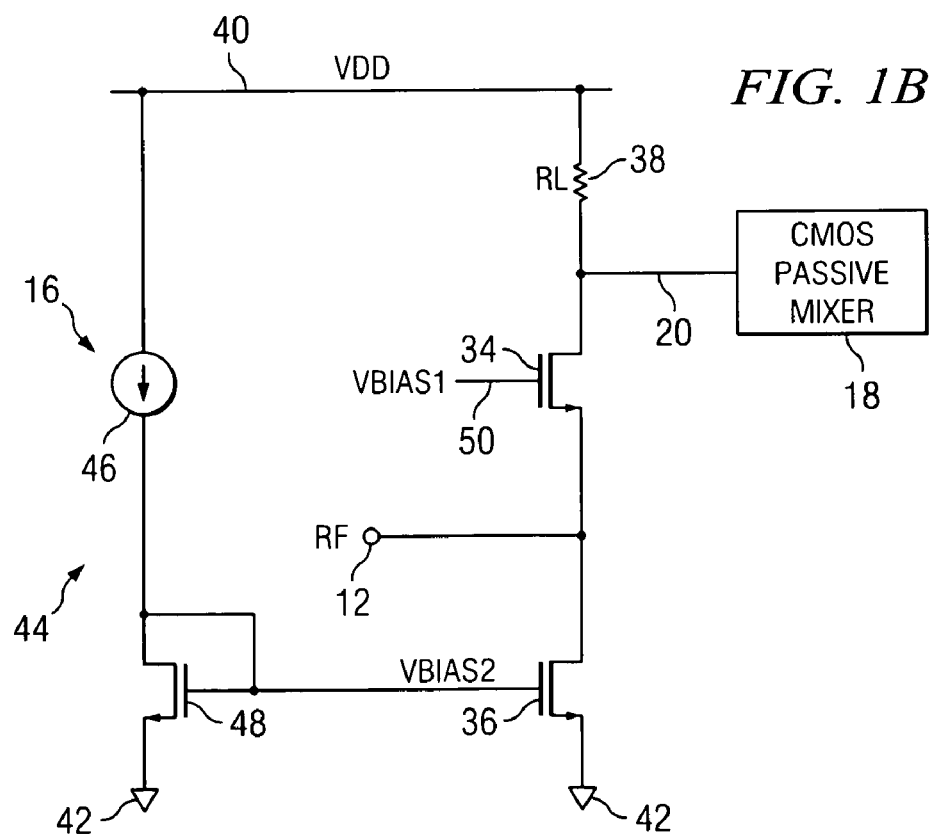
FIG. 1B illustrates a common design structure of the input gain stage of FIG. 1A.
Figure 2:
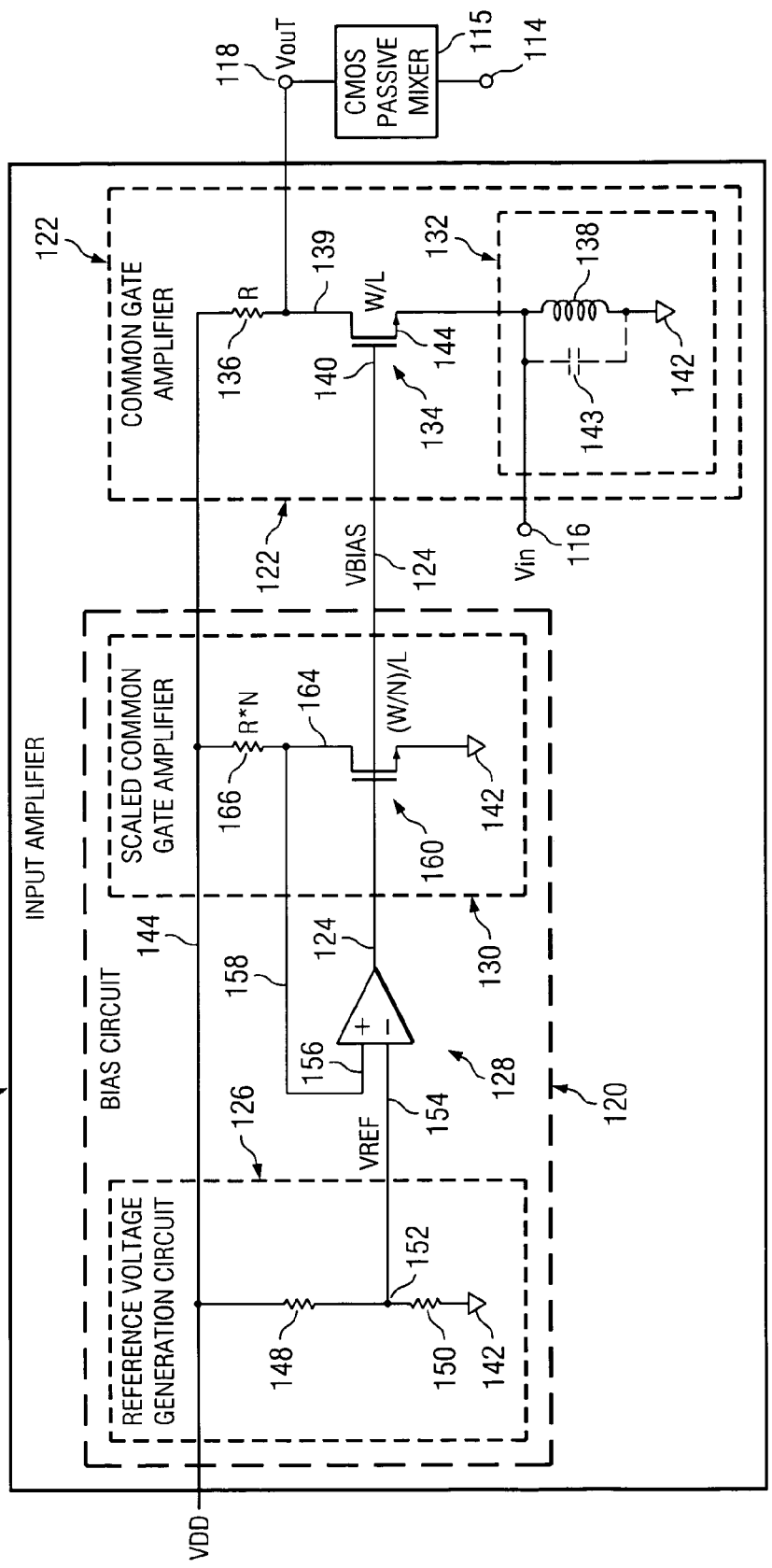
FIG. 2 is a circuit diagram illustrating a frequency converter and associated input amplifier according to the teachings of the invention.

Embodiments of the present invention and its advantages are best understood by referring to FIGS. 1 through 2 of the drawings, like numerals being used for like and corresponding parts of the various drawings.

FIG. 1A illustrates a conventional frequency converter 10 that converts a radio frequency signal received at node 12 into an intermediate frequency signal at node 14. A conventional usage for such a frequency converter 10 is a cellular telephone that receives radio frequency signals; however, such a converter may be used in any wireless receiver, including those operating at frequencies lower than radio frequency signals. Typically, such radio frequency signals are converted to a lower frequency because the lower frequency signals are processed more readily than the radio frequency signals.

Frequency converter 10 includes an input gain stage 16 and a passive mixer 18. A typical gain is 10 dB, although other gains are used. Input gain stage 16 receives radio frequency signals from node 12 and provides those signals as an output at 20 to passive mixer 18. Passive mixer 18 operates to perform the frequency down conversion of the amplified signal at 20. Passive mixer 18 includes a transistor 22 that is controlled by an oscillator 24, as well as a capacitor 26.

In general, oscillator 24 turns on transistor 22 at appropriate time intervals to allow the radio frequency signal to pass through to output 14 and turns off to block transmission of the radio frequency signal. Thus, in effect, oscillator 24 and transistor 22 "sample" the amplified radio frequency signal at 20 resulting in an intermediate frequency signal at 14. One example application may involve the receipt of 2.4 gigahertz radio frequency signals at node 12 with oscillator 24 operating at 2.3 gigahertz, resulting in an intermediate frequency signal at node 14 of the difference between the two, which in this case is 100 megahertz.

A capacitor 26 is provided in mixer 18 and is connected to ground 28 as a filtering mechanism to filter high frequency signals. Additional details of a common design structure for input gain stage 16 is illustrated in FIG. 1B.

FIG. 1B is a circuit diagram illustrating a common design structure of input gain stage 16. Input gain stage 16 includes a common gate transistor 34 and a current source transistor 36 with an associated load resistor 38 connected to a voltage source 40. Common gate transistor 34 is referred to as a common gate transistor because its gate terminal is AC ground. The source of current source transistor 36 is connected to ground 42. Input gain stage 16 also includes a current mirror 44 formed from a current source 46 and a transistor 48 having its gate tied to its drain. This common design structure transistor 34 has its gate biased by a set bias voltage 50.

In operation, a radio frequency signal at node 12 is amplified to produce an amplified signal at node 20. Current source transistor 36 sets the bias current for common gate transistor 34 and provides a path for DC current to flow to ground 42. Current source transistor is biased by current mirror 48.

Resistive load 38 is conventionally used in order to achieve good linearity, rather than an active load. However, this approach suffers from several disadvantages. First, for low voltage design requirements in many processes including CMOS processes, this approach suffers from limited allowable output voltage swing due to the existence of two stacked transistors, 34 and 36, which result in limited linearity performance. Second, when resistive load 38 is used, the linearity performance is strongly dependent on process and temperature. This occurs because in order to maintain the optimal linearity performance of input gain stage 16, the output at 20 is biased around the midpoint between the largest and smallest allowable voltage. Doing this provides the maximum output voltage swing without waveform clipping; however, with the constant bias current approach, the large variation of resistance values over process and temperature could shift the output bias far away from the original point at different process corners or at different temperatures. This results in variation in the DC component of the output voltage at node 20 and therefore inconsistent linearity performance from lot to lot and over a specified temperature range. Because of this, the common-gate amplifier approach illustrated in FIG. 1B usually becomes the limiting source for linearity when used as a gain stage prior to the highly linear passive mixers.

According to the teachings of the invention, a frequency converter and associated amplifier are provided that result in a linear output and which, in some embodiments, has an output that is insensitive to process, voltage, and temperature.

FIG. 2 is a circuit diagram illustrating a frequency converter 110 according to the teachings of the invention. As illustrated, frequency converter 110 includes an input amplifier 112 and a CMOS passive mixer 115. Although the invention is described in the context of providing amplification for a CMOS passive mixer, it will be understood that embodiments of the invention may be utilized to provide an amplified signal outside the context of a CMOS passive mixer.

Input amplifier 112 receives an input at 116 and produces an amplified signal at node 118. Input amplifier 112 includes a bias circuit 120 and a common gate amplifier circuit 122. Bias circuit 120 biases gate amplifier circuit 122 by a bias signal on line 124. Bias circuit 120 includes a reference voltage generation circuit 126, an operational amplifier 128, and a scaled common gate amplifier 130.

Common gate amplifier 122 includes an AC blocking circuit 132, a common gate transistor 134, and a resistive load 136. Common gate transistor 134 amplifies the signal received at node 116 and produces an output signal on node 118. The characteristics of transistor 134 such as gain, current, and noise, may be determined based on desired performance requirements. Transistor 134 is biased on its gate 140 by bias node 124 received from bias circuit 120. Generation of the bias signal on bias node 124 is described in greater detail below. Resistive load 136 is used to provide gain and an output impedance for the amplifier. Blocking circuit 132 provides a path to ground for direct current signals but blocks transmission of alternating current signals. In this example, blocking circuit includes an inductor 138 in parallel with a capacitor 143 between the source 144 of transistor 134 and ground 142. Blocking circuit 132, in effect, replaces the current source transistor 36 of FIG. 1B and has the effect of increasing the allowable output voltage swing because of the lack of the associated voltage drop of the transistor. Capacitor 143 may be used to resonate with inductor 138 at the frequency of interest to block the alternating current signal path to ground. In one example, this capacitor 143 can be the parasitic capacitance at the source terminal of transistor 134 while the value of the inductor is determined by resonating out the parasitic capacitance at the input frequency. The removal of transistor 36 providing at least 100 millivolts of additional allowable swing in the output voltage, and using inductor 138 to resonate out the input capacitance provides a pure resistive loading for a radio frequency input signal (or other frequency signal). The illustrated approach is particularly suitable for low voltage design because only one active transistor 134 is present between the supply voltage 144 and ground. The resulting output at node 118 is an amplified version of input at 116 having a DC voltage component equal to the referenced voltage, described in greater detail below.

Bias circuit 120 generates a bias signal on bias line 124 for biasing transistors 134 and 160. This bias voltage generation involves reference voltage generation circuit 126, operational amplifier 128, and scaled common gate amplifier 130. The primary purpose of the bias circuit 120 is to set the DC output voltage at 118 to a constant, desired level that maximizes linearity of Input amplifier 112.

Reference voltage generation circuit includes, in this example, two resistors 148 and 150 in series between supply voltage 144 and ground 142. Thus, in this example, reference voltage generation circuit is a voltage divider utilizing resistors formed from the same process such that any variations in the process used to form resistor 148 and 150 will be canceled. This renders the generation of a reference voltage at a node 152 that is independent of process variation, as well as temperature variation.

This constant reference voltage at node 152 is provided to operational amplifier 128 at an input 154. Operational amplifier 128 generates a bias signal 124. The other input of 156 of operational amplifier 128 is provided a feedback signal from scaled common gate amplifier 130 at line 158. In general, the feedback signal at line 158 is indicative of, or equal to, the output at node 118. This is accomplished by constructing, in this example, scaled common gate amplifier 130 that is a scaled down version of common gate amplifier 122. Thus, by using a scaled version of common gate amplifier 122, a feedback signal indicative of output 118 should be provided without suffering from the disadvantage of disturbing amplifier 122 at high frequencies, which could result if feedback were taken directly from common gate amplifier 122. Scaled common gate amplifier 130 is a scaled down version of common-gate amplifier 122 (without blocking circuit 122) to avoid pulling too much current. In this example, scaled common gate amplifier 130 includes a transistor 160 and a resistive load 166. The resistance of resistive load 166 is chosen to be a multiple of the resistance of resistor 136. Likewise, the width and therefore amplification of transistor 160 is that of transistor 134 divided by that same multiple. As illustrated, both transistor 160 and transistor 134 are biased by bias signal on bias line 124. Operational amplifier 128 operates to adjust its output at 124 to make its inputs 158 and 154 approximately equal, thereby setting the DC component of the output at 118 to the reference voltage.

Thus, bias circuit 120 provides a bias scheme that maintains the output bias around the optimal point for linearity performance, regardless of the variation in process, voltage, and temperature. The feedback loop with the operational amplifier 128 is used to maintain the output voltage of the amplifier 128 near the reference voltage. The DC voltage of the output of the amplifier 122 is independent of process, voltage, and temperature because the reference voltage is independent of process, voltage, and temperature.

Table 1 illustrates advantages of one example embodiment of the amplifier 112 of FIG. 2. This table was generated using a two tone input third-order intercepted point (IIP3) simulation over process corners and temperatures. As illustrated, the approach of FIG. 2 has better IIP3 and much less variation over process corners and temperature than the conventional design of FIGS. 1A and 1B, resulting in a desirable amplifier design.

TABLE 1

Comparison of IIP3 simulation data between conventional design and one embodiment of the present invention over process corners and temperature.

| IIP3 | Weak Process/ −20° C. | Weak Process/ 100° C. | Nominal Process/ 27° C. | Strong Process/ −20° C. | Strong Process/ 100° C. |
|---|---|---|---|---|---|
| Conventional Design | −3.7 dBm | 9.1 dBM | 5.09 dBM | −0.95 dBM | 9.28 dBM |
| One Embodiment of Present Invention | 8.4 dBM | 7.01 dBM | 10.41 dBM | 13.27 dBM | 11.58 dBM |

What is claimed is:

1. A frequency converter comprising:
a CMOS passive mixer having a mixer input node;
an input amplifier operable to receive a radio frequency signal at an amplifier input node, amplify the radio frequency signal, and provide the amplified signal to the mixer input node of the CMOS passive mixer, the input amplifier comprising:
a bias circuit comprising:
a reference voltage generation circuit operable to receive a supplied voltage and generate a first reference voltage, the reference voltage generation circuit comprising first and second resistors connected in series between the supply voltage and the second reference voltage;
an operational amplifier operable to receive the first reference voltage and produce as an output a voltage indicative of a difference between the reference voltage and a gain stage output; and
a scaled common gate amplifier comprising a first transistor having a gate connected to the output of the operational amplifier and a drain connected to a first resistor; and
a common gate amplifier comprising a second transistor having a gate connected to the output of the operational amplifier of the bias circuit, a drain connected to a second resistor and to the input node of the CMOS passive mixer, and a source connected to the amplifier input node; and
wherein a ratio of the resistance of the first resistor to the second resistor is approximately the same as a ratio of the size of the second transistor to the size of the first transistor.

2. The frequency converter of claim 1, wherein the common gate amplifier further comprises a capacitor in parallel with the inductor.

3. The frequency converter of claim 1, wherein the second reference voltage is ground.

4. The frequency converter of claim 1, wherein the first reference voltage is approximately equal to a voltage level determined to be optimal for linearity performance of the input amplifier.

5. An amplifier comprising:
a gate bias circuit operable to generate a gate bias voltage; and
a common gate amplifier comprising a first transistor having a gate biased by an output of the gate bias circuit and having a source connected to an inductor for providing a path to ground for direct current flowing through the first transistor; and
wherein the gate bias circuit comprises:
a reference voltage generation circuit operable to generate a reference voltage at a reference voltage node;
a scaled common gate amplifier having a second transistor having a gate receiving the gate bias voltage, a source connected to ground, and a drain connected to a second resistor; and
a comparator operable to compare the first reference voltage to any voltage on the drain of the second transistor at the scaled common gate amplifier and generate a gate bias voltage based on the comparison.

6. The amplifier of claim 5, wherein the reference voltage generation circuit comprises first and second resistors connected in a series between a voltage source and a second reference voltage.

7. The amplifier of claim 6, wherein the second reference voltage is ground.

8. The amplifier of claim 5, wherein the comparator is an operational amplifier.

9. An amplifier consisting essentially of:
a gate bias circuit operable to generate a gate bias voltage;
a common gate amplifier comprising a first transistor having a gate biased by an output of the gate bias circuit and having a source connected to an inductor for providing a path to ground for direct current flowing through the first transistor;
a first resistor in series with the first transistor and a voltage supply, the first resistor being a load for the amplifier, wherein the gate bias circuit comprises:
a reference voltage generation circuit operable to generate a reference voltage at a reference voltage node;
a scaled common gate amplifier having a second transistor having a gate receiving the gate bias voltage, a source connected to ground, and a drain connected to a second resistor; and
a comparator operable to compare the first reference voltage to any voltage on the drain of the second transistor at the scaled common gate amplifier and generate a gate bias voltage based on the comparison.

10. The amplifier of claim 9, wherein a ratio of the resistance of the first resistor to the second resistor is approximately the same as the ratio of the gain of the first transistor to the gain of the second transistor.

11. A method of amplifying a signal by an amplifier comprising:
generating a gate bias voltage indicative of a difference between a reference voltage and an output voltage of the amplifier wherein generating a gate bias voltage comprises generating a gate bias voltage in response to receiving a feedback signal indicative of the output voltage of the amplifier;
biasing the gate of a common gate amplifier with the gate bias voltage; and blocking, by a passive device, alternating current signals from flowing from the source of the common gate amplifier to ground.

12. The method of claim 11, wherein blocking alternating current signals comprises blocking alternating current signals by an inductor.

13. The method of claim 11, wherein blocking alternating current signals comprises blocking alternating current signals by an inductor in parallel with a capacitor.

14. The method of claim 11, wherein the feedback signal comprises an output of a scaled replica of a portion of the common gate amplifier.

15. The method of claim 11, wherein generating a gate bias voltage comprises generating a gate bias voltage by an operational amplifier.

* * * * *